US012587209B2

(12) United States Patent
Goodson

(10) Patent No.: US 12,587,209 B2
(45) Date of Patent: Mar. 24, 2026

(54) INTERMEDIATE FREQUENCY DIGITAL-TO-ANALOG CONVERSION (IFDAC) SYSTEM

(71) Applicant: Shure Acquisition Holdings, Inc., Niles, IL (US)

(72) Inventor: Michael J. Goodson, Union, IL (US)

(73) Assignee: Shure Acquisition Holdings, Inc., Niles, IL (US)

( * ) Notice: Subject to any disclaimer, the term of this patent is extended or adjusted under 35 U.S.C. 154(b) by 92 days.

(21) Appl. No.: 18/591,217

(22) Filed: Feb. 29, 2024

(65) Prior Publication Data

US 2024/0297664 A1 Sep. 5, 2024

Related U.S. Application Data

(60) Provisional application No. 63/488,214, filed on Mar. 3, 2023.

(51) Int. Cl.
*H03M 3/00* (2006.01)

(52) U.S. Cl.
CPC ............. *H03M 3/368* (2013.01); *H03M 3/39* (2013.01); *H03M 3/50* (2013.01)

(58) Field of Classification Search
CPC ........... H03M 3/368; H03M 3/39; H03M 3/50
USPC ................................................ 341/143, 144
See application file for complete search history.

(56) References Cited

U.S. PATENT DOCUMENTS

| | | | |
|---|---|---|---|
| 6,229,861 B1 | | 5/2001 | Young |
| 6,234,658 B1 | * | 5/2001 | Houldsworth .......... G06F 17/10 |
| | | | 716/101 |
| 6,651,181 B1 | | 11/2003 | Lacey |
| 6,718,477 B1 | | 4/2004 | Plants et al. |
| 6,963,297 B2 | | 11/2005 | Robinson et al. |
| 7,020,221 B2 | | 3/2006 | Glas et al. |
| 7,227,910 B2 | | 6/2007 | Lipka |
| 7,353,419 B1 | | 4/2008 | Liu |
| 7,443,250 B2 | | 10/2008 | Seethamraju et al. |

(Continued)

FOREIGN PATENT DOCUMENTS

| | | | |
|---|---|---|---|
| CN | 112260890 B | 9/2022 | |
| WO | WO2005036922 * | 4/2005 | ............... H04R 1/00 |

OTHER PUBLICATIONS

Jun. 26, 2024—(WO) International Search Report and Written Opinion—App PCT/US2024/017822.

(Continued)

*Primary Examiner* — Jean B Jeanglaude

(74) *Attorney, Agent, or Firm* — Banner & Witcoff, Ltd.

(57) ABSTRACT

The present disclosure describes a digital-to-analog converter (DAC) comprising a programmable integrated circuit, a resampler, and a clock. The programmable integrated circuit may be configured to perform delta-sigma modulation to convert a digital signal to a coarse representation of an analog signal. The coarse representation of the analog signal may be sent to a first-stage of the resampler. After processing the signal, the first-stage of the resampler may pass a continuous signal to the second-stage of the resampler. The second-stage of the resampler produce a clean sampling instant for the signal that represents the point in time where the signal transitions from discrete time to continuous time. The analog signal may then be outputted to one or more receivers.

20 Claims, 6 Drawing Sheets

(56)                References Cited

U.S. PATENT DOCUMENTS

| | | | |
|---|---|---|---|
| 8,570,200 | B2 | 10/2013 | Ashburn, Jr. et al. |
| 8,755,447 | B2 | 6/2014 | Goodson et al. |
| 8,855,215 | B2 | 10/2014 | Roberts et al. |
| 8,995,569 | B2 | 3/2015 | Loh et al. |
| 9,036,762 | B2 | 5/2015 | Green |
| 9,397,675 | B1 | 7/2016 | Goodson et al. |
| 10,895,850 | B1 | 1/2021 | Elkholy |
| 2008/0084343 | A1 | 4/2008 | Heyl et al. |
| 2010/0329482 | A1 | 12/2010 | Lee |
| 2017/0331490 | A1* | 11/2017 | Maehata ................... H03K 7/08 |
| 2022/0191001 | A1 | 6/2022 | Poulsen et al. |
| 2023/0006712 | A1 | 1/2023 | Mamola et al. |

OTHER PUBLICATIONS

McCue, Jamin J.: "An Interleaved Multi-mode [increment] [Sigma] RF-DAC with Fully Integrated, AC Coupled Digital Input", Jan. 1, 2015 (Jan. 1, 2015), pp. 1-181, XP055882382, Retrieved from the Internet: URL:https://etd.ohiolink.edu/apexprod/rws_etd/send_file/send?accession=osu1449108272&disposition=inline [retrieved on Jan. 21, 2022] pp. 7 , 10 , 70, 76 , 78 , 85 ; figures 1.4, 4.1, 4.2, 5.1.
Eduardo Alcain: "Hardware Architectures for Real-Time Medical Imaging", Electronics, vol. 10, No. 24, Dec. 15, 2021 (Dec. 15, 2021), pp. 1-34, XP093167617, Basel, Switzerland ISSN: 2079-9292, DOI: 10.3390/electronics10243118 Retrieved from the Internet: URL:https://www.mdpi.com/2079-9292/10/24/3118/pdf?version=1639533198> figure 6.
Lars Risbo: "FPGA based 32 times oversampling 8th-order Sigma-Delta audio Dac", AES 96th Convention, Feb. 26, 1994 (Feb. 26, 1994), pp. 1-15, XP093167880, Amsterdam, Netherlands Retrieved from the Internet: URL:https://www.aes.org/tmpFiles/elib/20240528/6424.pdf> figure 1.
Susan Luschas et al. "Radio Frequency Digital-to-Analog Converter." IEEE Journal of Solid-State Circuits, vol. 39, No. 9, pp. 1462-1467.
"Section 3—DACs, DDSs, PLLs, and Clock Distribution" High Speed System Applications. Analog Devices, Inc. 2006.
Toan Quang The Bui et al. "FPGA-Based Autonomous GPS-Disciplined Oscillators for Wireless Sensor Network Nodes" Apr. 20, 2022.
Mats Hovin et al. "A Narrow-Band Delta-Sigma Frequency-to-Digital Converter" Jul. 1997.
Mattia Rizzi et al. "White Rabbit Clock Characteristics." Sep. 2016.
John Grandberg. "DA-Art Aquilla II DAC & headphone amplifier review" Feb. 12, 2021.

* cited by examiner

600

INTERMEDIATE FREQUENCY DIGITAL-TO-ANALOG CONVERSION (IFDAC) SYSTEM

REFERENCE TO RELATED APPLICATIONS

This application claims priority to U.S. Provisional Patent Application No. 63/488,214, entitled "Intermediate Frequency Digital-to-Analog (IFDAC) System" and filed on Mar. 3, 2023, which is incorporated by reference herein in its entirety.

FIELD OF THE INVENTION

Aspects of the disclosure relate generally to a digital-to-analog converter (DAC). More specifically, aspects of the disclosure describe a DAC with a two-stage resampler.

BACKGROUND OF THE INVENTION

Modern signal processing systems are typically implemented digitally. That is, signal processing systems typically process digital signals having discrete timing and/or discrete amplitude. While most processing is performed on digital signals, many signals originate and/or conclude as analog signals, which have continuous timing and/or continuous amplitude. Accordingly, the analog signals need to be converted from analog to digital and vice versa. This process is typically done using specialized circuits called "data converters," which are used to transition from analog to digital (ADC) and digital to analog (DAC). These data converters are central to any system and have a significant impact on cost and performance. However, these data converters may not remove all artifacts from the signals being processed. Moreover, the inexpensive converters may add artifacts, which may result in signal degradation. Accordingly, there is a need for a low cost data converter that results in a high-quality signal with few artifacts.

SUMMARY OF THE INVENTION

The following presents a simplified summary of various aspects described herein. This summary is not an extensive overview, and is not intended to identify key or critical elements or to delineate the scope of the claims. The following summary merely presents some concepts in a simplified form as an introductory prelude to the more detailed description provided below.

Aspects described herein may relate to a digital-to-analog converter (DAC) that converts digital signals to analog signals. The DAC may comprise a programmable (or configurable) integrated circuit (e.g., field programmable gate array (FPGA)), a resampler, and a clock. The programmable integrated circuit may be configured to perform delta-sigma modulation to convert a digital signal to a coarse representation of an analog signal. The coarse representation of the analog signal may be sent to the resampler. The resampler may comprise a two-stage resampler. The first-stage of the resampler may comprise a D Flip Flop (DFF) component. The second-stage of the resampler may comprise a pulse resampler. In some examples, the second-stage resampler may comprise a raised-cosine filter configured to perform raised-cosine pulse resampling. The two-stage resampling process may produce a clean sampling instant for the signal that represents the point in time where the signal transitions from discrete time to continuous time. Additionally, the two-stage resampler significantly reduces timing jitter and/ or additive noise. Finally, the clock may drive the programmable integrated circuit and the resampler.

BRIEF DESCRIPTION OF DRAWINGS

The present disclosure is illustrated by way of example and not limited in the accompanying figures in which like reference numerals indicate similar elements and in which.

DETAILED DESCRIPTION OF THE INVENTION

In the following description of the various embodiments, reference is made to the accompanying drawings, which form a part hereof, and in which is shown by way of illustration various embodiments in which aspects of the disclosure may be practiced. It is to be understood that other embodiments may be utilized and structural and functional modifications may be made without departing from the scope of the present disclosure. Aspects of the disclosure are capable of other embodiments and of being practiced or being carried out in various ways. Also, it is to be understood that the phraseology and terminology used herein are for the purpose of description and should not be regarded as limiting. Rather, the phrases and terms used herein are to be given their broadest interpretation and meaning. The use of "including" and "comprising" and variations thereof is meant to encompass the items listed thereafter and equivalents thereof as well as additional items and equivalents thereof.

By way of introduction, aspects described herein may relate to a digital-to-analog converter (DAC) that converts digital signals to analog signals. The DAC may comprise a programmable (or configurable) integrated circuit (e.g., a field programmable gate array (FPGA)), a resampler, and a clock. The programmable integrated circuit may be configured to receive a digital signal, such as an intermediate frequency digital signal, and perform delta-sigma modulation to convert the digital signal to a coarse representation of an analog signal. The coarse representation of the analog signal may be sent to the resampler. The resampler may comprise a two-stage resampler. The two-stage resampler may output an analog signal, which may be transmitted to one or more receivers (e.g., an in-ear monitor, a speaker, etc.). The simple and/or minimal nature of the DAC described herein provides exceptionally low power consumption, which makes it ideal for lower power applications, such as portable devices, remote heads, etc.

Figure 1:
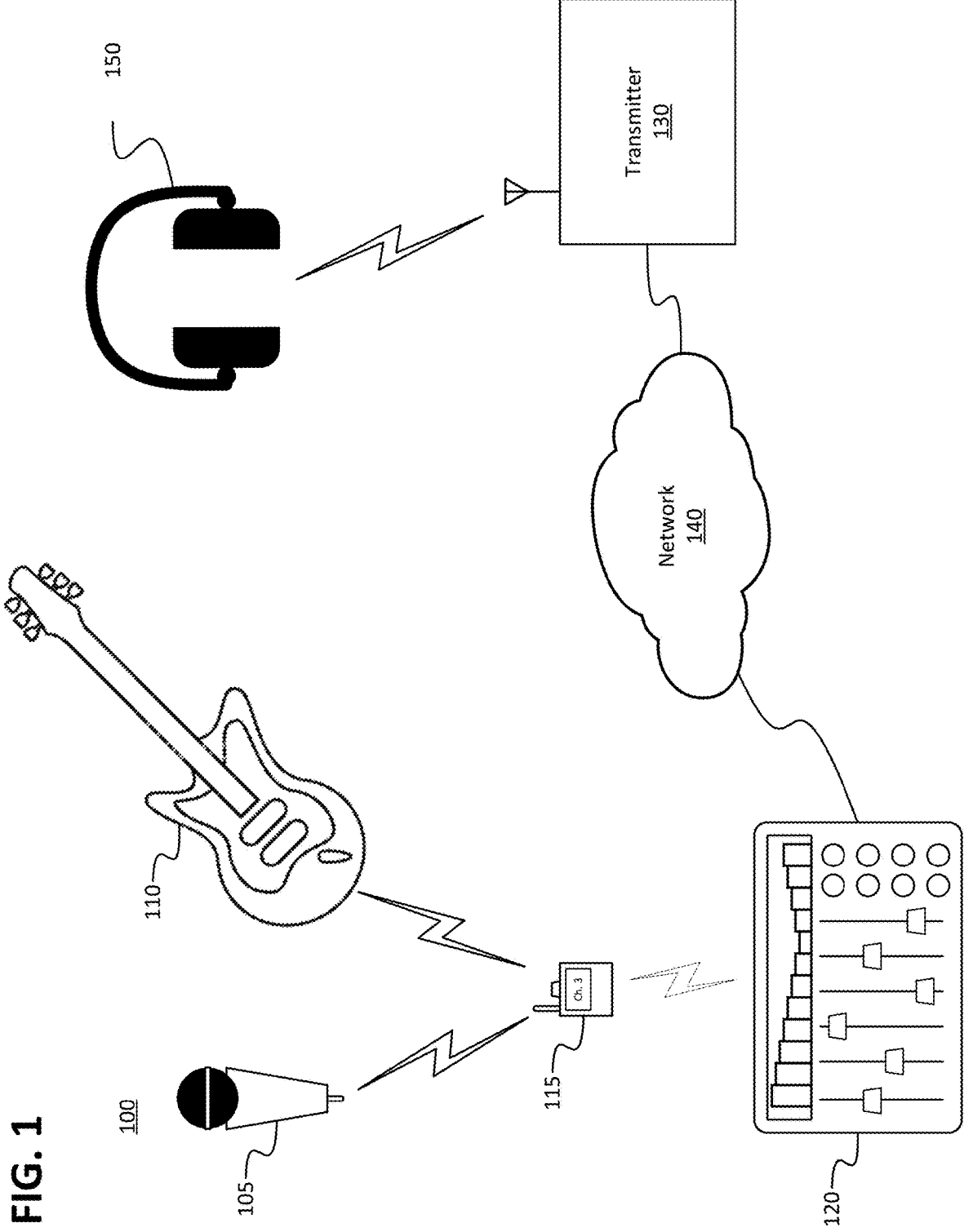
FIG. 1 shows an example of a personal monitoring system (PSM) in accordance with one or more aspects of the disclosure.

FIG. 1 illustrates one example of a distributed personal monitoring system (DPSM) 100 in accordance with one or more aspects of the disclosure. DPSM 100 may comprise a first input device 105, a second input device 110, a first receiver 115, a computing device 120, a transmitter 130, and a second receiver 150. The computing device 120 and the transmitter 130 may be connected via network 140.

As shown in FIG. 1, first input device 105 comprises a microphone and second input device 110 comprises a guitar. While a microphone and guitar are depicted in FIG. 1, it will be appreciated that the first input device 105 and the second input device 110 may comprise any input device capable of capturing and/or obtaining sound waves and/or other audio input. First device 105 and second device 110 may each comprise an output (not shown) configured to connect with a receiver, such as receiver 115. The output may comprise a wired connection, such as an audio jack (e.g., XLR interface, 3.5 mm jack, RCA jacks, RJ45 female connectors, etc.), or a wireless transmitter configured to communicate using any short-range wireless protocol, such as Bluetooth, Zigbee, Z-Wave, ANT, LoRa, or any equivalent thereof.

Receiver 115 may be communicatively coupled to first input device 105 and/or second input device 110. Additionally, receiver 115 may be communicatively coupled to computing device 120. In this regard, the receiver 115 may comprise one or more input devices (not shown) configured to receive one or more first analog signals from first input device 105 and/or second input device 110. Upon receiving the one or more first analog signals, receiver 115 may convert the one or more first analog signals to one or more digital signals, for example, using an analog-to-digital converter (ADC) (not shown). Receiver 115 may process the one or more digital signals, for example, using one or more digital signal processing techniques. Receiver 115 may then convert the one or more processed digital signals to one or more second analog signals, for example, using a digital-to-analog converter (DAC). Receiver 115 may then output the one or more second analog signals to computing device 120. The one or more second analog signals may be sent via an output device, such as a wireless transceiver. The wireless transceiver may be configured to communicate using any short-range wireless protocol, such as Bluetooth, Zigbee, Z-Wave, ANT, LoRa, or any equivalent thereof. Additionally or alternatively, receiver 115 may output digital signals, for example, via a wired connection to computing device 120. In these instances, digital signals may bypass the DAC prior to be transmitted.

Computing device 120 may be any computing device capable of receiving one or more signals outputted by receiver 115. As noted above, the signals outputted by receiver 115 may comprise analog signals and/or digital signals. For analog signals, computing device 120 may comprise one or more transceivers, or any other suitable analog interface, configured to receive the one or more analog signals. The one or more transceivers may be configured to communicate using any short-range wireless protocol, such as Bluetooth, Zigbee, Z-Wave, ANT, LoRa, or any equivalent thereof. For digital signals, computing device 120 may comprise a digital interface configured to receive one or more digital signals from receiver 115. In some instances, computing device 120 may comprise a soundboard, a mixing table, a mixing console, an audio mixer, a mixer desk, a sound mixer, or any equivalent thereof. Additionally or alternatively, computing device 120 may execute an application configured to mix audio like a soundboard, a mixing table, a mixing console, a mixing desk, an audio mixer, a sound mixer, etc. In some instances, computing device 120 may be equivalent to a computing device, such as computing device 200, discussed below with respect to FIG. 2. Computing device 120 may be configured to mix, or combine, one or more analog signals received from the one or more input devices (e.g., first input device

105, second input device 110) and output the mixed signals. Additionally or alternatively, computing device 120 may be configured to provide: phantom power, for example, for condenser microphones, pan control, filtering and equalization, dynamic range compression, routing facilities, and/or monitoring facilities. Additionally or alternatively, computing device 120 may be configured to send the signal to another device, such as a sound recording system, a control room, or a rack mounted transmitter—such as transmitter 130, for example via network 140.

Network 140 may include a local area network (LAN), a wide area network (WAN), a wireless telecommunications network, and/or any other communication network or combination thereof. It will be appreciated that the network connections shown are merely illustrative and any means of establishing a communications link between the devices of DPSM 100 may be used. The existence of any of various network protocols such as AES3, AES67, Dante, RTP, TCP/IP, Ethernet, FTP, HTTP, and the like, and of various wireless communication technologies such as IEEE 802.11, GSM, CDMA, WiFi, and LTE, is presumed, and the various computing devices described herein may be configured to communicate using any of these network protocols or technologies.

The data transferred to and from various computing devices in DPSM 100 may include secure and sensitive data. Therefore, it may be desirable to protect transmissions of such data using secure network protocols and encryption, and/or to protect the integrity of the data when stored on the various computing devices. For example, a file-based integration scheme or a service-based integration scheme may be utilized for transmitting data between the various computing devices. Data may be transmitted using various network communication protocols. Secure data transmission protocols and/or encryption may be used in file transfers to protect the integrity of the data, for example, File Transfer Protocol (FTP), Secure File Transfer Protocol (SFTP), and/or Pretty Good Privacy (PGP) encryption. In many embodiments, one or more web services may be implemented within the various computing devices. Web services may be accessed by authorized external devices and users to support input, extraction, and manipulation of data between the various computing devices in the system 100. Web services built to support a personalized display system may be cross-domain and/or cross-platform, and may be built for enterprise use. Data may be transmitted using the Secure Sockets Layer (SSL) or Transport Layer Security (TLS) protocol to provide secure connections between the computing devices. Web services may be implemented using the WS-Security standard, providing for secure SOAP messages using XML encryption. Specialized hardware may be used to provide secure web services. For example, secure network appliances may include built-in features such as hardware-accelerated SSL and HTTPS, WS-Security, and/or firewalls. Such specialized hardware may be installed and configured in the DPSM 100 in front of one or more computing devices such that any external devices may communicate directly with the specialized hardware.

Transmitter 130 may be an external computing device configured to receive one or more signals from computing device 120. The one or more signals received from computing device 120 may comprise analog signals and/or digital signals. Transmitter 130 may process the one or more received signals and output one or more signals to one or more receivers, such as receiver 150. As will be discussed in greater detail below with respect to FIG. 3, transmitter 130 may comprise one or more inputs, an ADC, a digital signal processor (DSP), a DAC, and/or one or more outputs. Transmitter 130 may be configured to receive one or more signals via the one or more inputs. When the one or more received signals comprise analog signals, the analog signals may be converted to one or more digital signals using the ADC, which are then processed using the digital signal processor. After being processed, the one or more digital signals may be converted to one or more second analog signals, for example, using a DAC. The one or more second analog signals may then be outputted (e.g., transmitted, sent), via the one or more outputs, to one or more receivers, such as receiver 150. In some instances, transmitter 130 may output digital signals. The digital signals may bypass the DAC to be transmitted via one or more digital interfaces.

Receiver 150 may be configured to receive one or more signals from transmitter 130. Additionally or alternatively, receiver 150 may be configured to output the one or more analog signals as an audio signal. Preferably, the audio signal may be within a range of human-perception. Prior to outputting the audio signal, receiver 150 may receive the one or more analog signals via one or more inputs. The one or more inputs may comprise one or more transceivers configured to communicate using any short-range wireless protocol, such as Bluetooth, Zigbee, Z-Wave, ANT, LoRa, or any equivalent thereof. Additionally or alternatively, the one or more inputs may comprise receivers configured to receive one or more signals in the ultra high frequency (UHF) band. The one or more analog signals may be converted to one or more digital signals using an ADC. Subsequently, the one or more digital signals may be processed using a digital signal processor. The one or more digital signals may be converted back to an analog signal, for example, using a DAC. The analog signal may then be outputted, for example, via a speaker. In some instances, receiver 150 may comprise an in-ear monitor or an in-ear receiver. Alternatively, receiver 150 may comprise headphones or earbuds. As yet another alternative, receiver 150 may comprise a speaker.

Figure 2:
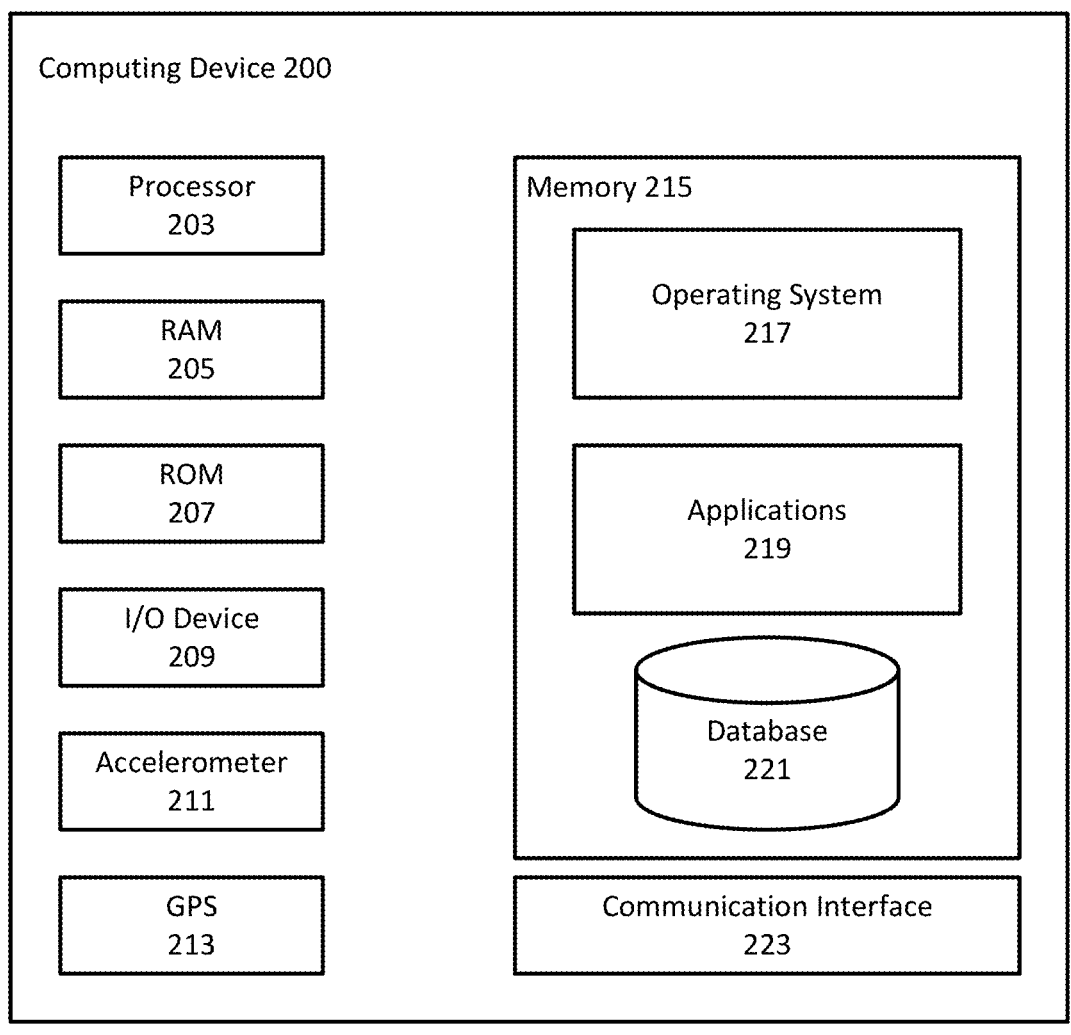
FIG. 2 shows an example computing device in accordance with one or more aspects of the disclosure.

Any of the devices and systems described herein may be implemented, in whole or in part, using one or more computing devices described with respect to FIG. 2. Turning now to FIG. 2, a computing device 200 that may be used with one or more of the computational systems is described. The computing device 200 may comprise a processor 203 for controlling overall operation of the computing device 200 and its associated components, including RAM 205, ROM 207, input/output device 209, accelerometer 211, global-position system antenna 213, memory 215, and/or communication interface 223. A bus 202 may interconnect processor(s) 203, RAM 205, ROM 207, memory 215, I/O device 209, accelerometer 211, global-position system receiver/antenna 213, memory 215, and/or communication interface 223. Computing device 200 may represent, be incorporated in, and/or comprise various devices such as a desktop computer, a computer server, a gateway, a mobile device, such as a laptop computer, a tablet computer, a smart phone, any other types of mobile computing devices, and the like, and/or any other type of data processing device.

Input/output (I/O) device 209 may comprise a microphone, keypad, touch screen, and/or stylus through which a user of the computing device 200 may provide input, and may also comprise one or more of a speaker for providing audio output and a video display device for providing textual, audiovisual, and/or graphical output. Software may be stored within memory 215 to provide instructions to processor 203 allowing computing device 200 to perform various actions. For example, memory 215 may store software used by the computing device 200, such as an operating system 217, application programs 219, and/or an associated internal database 221. As noted above, application programs 219 may comprise at least one an application configured to mix audio like a soundboard, a mixing table, a mixing console, a mixing desk, an audio mixer, a sound mixer, etc. The various hardware memory units in memory 215 may comprise volatile and nonvolatile, removable and non-removable media implemented in any method or technology for storage of information such as computer-readable instructions, data structures, program modules, or other data. Memory 215 may comprise one or more physical persistent memory devices and/or one or more non-persistent memory devices. Memory 215 may comprise random access memory (RAM) 205, read only memory (ROM) 207, electronically erasable programmable read only memory (EEPROM), flash memory or other memory technology, optical disk storage, magnetic cassettes, magnetic tape, magnetic disk storage or other magnetic storage devices, or any other medium that may be used to store the desired information and that may be accessed by processor 203.

Accelerometer 211 may be a sensor configured to measure accelerating forces of computing device 200. Accelerometer 211 may be an electromechanical device. Accelerometer 211 may be used to measure the tilting motion and/or orientation computing device 200, movement of computing device 200, and/or vibrations of computing device 200. The acceleration forces may be transmitted to the processor to process the acceleration forces and determine the state of computing device 200.

GPS receiver/antenna 213 may be configured to receive one or more signals from one or more global positioning satellites to determine a geographic location of computing device 200. The geographic location provided by GPS receiver/antenna 213 may be used for navigation, tracking, and positioning applications. In this regard, the geographic may also include places and routes frequented by the first user.

Communication interface 223 may comprise one or more transceivers, digital signal processors, and/or additional circuitry and software, protocol stack, and/or network stack for communicating via any network, wired or wireless, using any protocol as described herein. In some instances, communication interface 223 may comprise one or more wired communication technologies, such as XLR interfaces, 3.5 mm jack receivers, RCA jacks, RJ45 female connectors, etc. The one or more wired communication technologies may be configured to communicate using network protocols, such as AES3, AES67, Dante, RTP, TCP/IP, Ethernet, FTP, HTTP, and the like. Additionally or alternatively, communication interface 223 may comprise one or more wireless transceivers. The one or more wireless transceivers may be configured to communicate using any short-range wireless protocol, such as Bluetooth, Zigbee, Z-Wave, ANT, LoRa, or any equivalent thereof. In further examples, communication interface 223 may comprise one or more wireless communication technologies, such as antennas configured to communicate using IEEE 802.11, GSM, CDMA, WiFi, LTE, and the like. It will be appreciated that communication interface 223 may use any combination of wired and wireless communication technologies to communicate with devices, such as computing device 120, transmitter 130, and/or receiver 150.

Processor 203 may comprise a single central processing unit (CPU), which may be a single-core or multi-core processor, or may comprise multiple CPUs. Processor(s) 203 and associated components may allow the computing device 200 to execute a series of computer-readable instructions (e.g., instructions stored in RAM 205, ROM 207, memory 215, and/or other memory of computing device 215, and/or in other memory) to perform some or all of the processes described herein. Although not shown in FIG. 2, various elements within memory 215 or other components in computing device 200, may comprise one or more caches, for example, CPU caches used by the processor 203, page caches used by the operating system 217, disk caches of a hard drive, and/or database caches used to cache content from database 221. A CPU cache may be used by one or more processors 203 to reduce memory latency and access time. A processor 203 may retrieve data from or write data to the CPU cache rather than reading/writing to memory 215, which may improve the speed of these operations. In some examples, a database cache may be created in which certain data from a database 221 is cached in a separate smaller database in a memory separate from the database, such as in RAM 205 or on a separate computing device. For example, in a multi-tiered application, a database cache on an application server may reduce data retrieval and data manipulation time by not needing to communicate over a network with a back-end database server. These types of caches and others may provide potential advantages in certain implementations of devices, systems, and methods described herein, such as faster response times and less dependence on network conditions when transmitting and receiving data.

Although various components of computing device 200 are described separately, functionality of the various components may be combined and/or performed by a single component and/or multiple computing devices in communication without departing from the disclosure.

Figure 3:
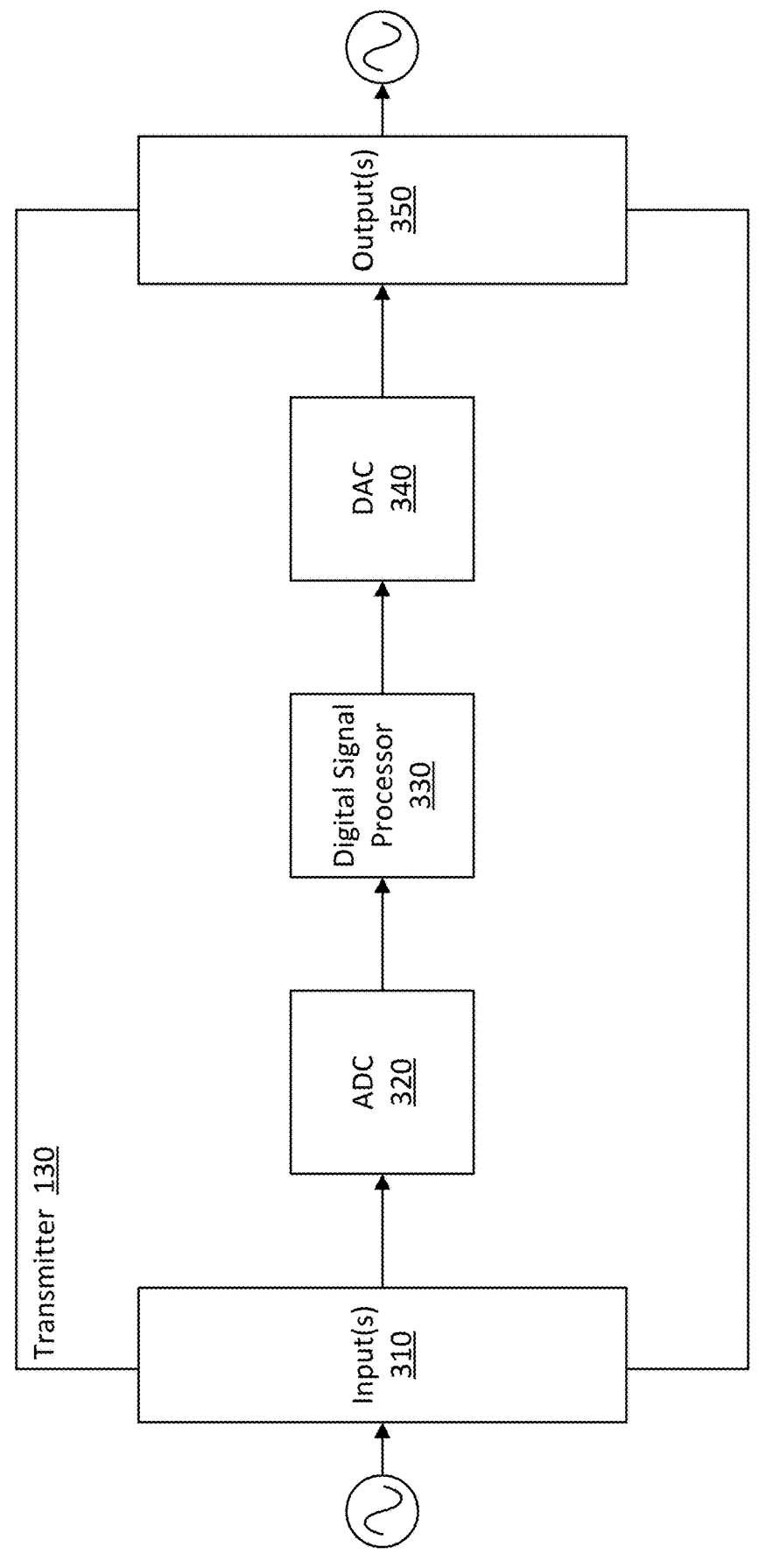
FIG. 3 shows an example of a transmitter in accordance with one or more aspects of the disclosure.

FIG. 3 shows an example of transmitter 130 according to one or more aspects of the disclosure. Transmitter 130 comprises one or more inputs 310, an analog-to-digital converter (ADC) 320, a digital signal processor (DSP) 330, a digital-to-analog converter (DAC), and/or one or more outputs 350. Transmitter 130 may be a rack mounted computing device configured to receive one or more first analog signals from a computing device (e.g., computing device 120) and output one or more second analog signals to one or more receivers (e.g., receiver 150).

One or more inputs 310 may be one or more wired and/or wireless inputs. One or more inputs 310 may comprise wired solutions, such as XLR interfaces, 3.5 mm jack receivers, RCA jacks, RJ45 female connectors, etc. Additionally or alternatively, one or more inputs 310 may comprise wireless solutions, such as transceivers, antennas, and/or protocol stacks configured to communicate via short-range wireless protocols, such as Bluetooth, Zigbee, Z-Wave, ANT, LoRa, or any equivalent thereof; networking protocols, such as AES3, AES67, Dante, RTP, TCP/IP, Ethernet, FTP, HTTP, and the like; and wireless protocols, such as IEEE 802.11, GSM, CDMA, WiFi, LTE, and the like. It will be appreciated that the one or more inputs 310 may use any combination of wired and wireless communication technologies and/or networking protocols to receive one or more signals, for example, from computing device 120. The one or more signals may be digital signals, for example, received via AES3, AES67, Dante, RTP, TCP/IP, Ethernet, FTP, HTTP, etc. Digital signals may bypass ADC 320. In this regard, the digital signals may be sent (e.g. transmitted) to DSP 330 for digital signal processing. Alternatively, the one or more signals may be analog signals, for example, when the one or more signals are received via a wireless interface. When the one or more signals comprise analog signals, the analog signals may be sent to ADC 320.

ADC 320 may be configured to convert analog signals received via the one or more inputs 310 into one or more digital signals. Although only one ADC 320 is shown in FIG. 3, it will be appreciated that transmitter 130 may comprise a plurality of ADCs and the description of ADC 320 may be associated with each of the plurality of ADCs. ADC 320 may convert the analog signal to a digital signal, for example, using delta-sigma modulation or any equivalent modulation technique. ADC 320 may be configured to encode an analog signal using high-frequency delta-sigma modulation. ADC 320 may then apply a digital filter to the signal to form a higher-resolution, but lower sample-frequency, digital output. The digital output may be sent (e.g., transmitted) to one or more digital signal processors (e.g., digital signal processor 330) for further processing.

DSP 330 may include a single central processing unit (CPU), which may be a single-core or multi-core processor, or may include multiple CPUs. Additionally or alternatively, DSP 330 may comprise a graphics processing unit (GPU). In some examples, DSP 330 may include a low-power processor and/or microcontroller, such as an Advanced RISC Machine (ARM) processor and/or any suitable field programmable array (FPGA), application specific integrated circuit (ASIC), or system on a chip (SOC). DSP 330 may be configured to perform audio signal processing, audio compression, speech processing, and/or speech recognition. After completing processing, DSP 330 may send the one or more digital signals to DAC 340.

DAC 340 may be configured to convert the one or more digital signals into one or more analog signals. While only one DAC 340 is shown in FIG. 3, it will be appreciated that transmitter 130 may comprise a plurality of DACs. Each DAC may support up to 16 users. As will be discussed in greater detail below with respect to FIG. 4, DAC 340 may convert the one or more digital signals using delta-sigma modulation or an equivalent modulation technique. Each of the one or more resultant analog signals may have an associated frequency. In some embodiments, the one or more resultant analog signals may have a frequency at, or around, 240 MHz. After generating the one or more analog signals, DAC 340 may output the one or more analog signals to the one or more outputs 350.

One or more outputs 350 may receive the one or more analog signals from DAC 340 and output the one or more signals. The one or more outputs 350 may be any of the wired and/or wireless interfaces discussed above with respect to the one or more inputs 310. The one or more signals may be outputted to one or more speakers and/or receivers, such as receiver 150 discussed above. In preferred examples, the one or more outputs 350 comprise four (4) antennas. Each of the four antennas comprises a carrier frequency (i.e., four, different carrier frequencies). Each carrier frequency may be associated with a channel. One or more outputs 350 may modulate the one or more resultant analog frequencies to a carrier frequency associated with each of the antennas. For example, a first analog signal may be modulated (e.g., using frequency modulation) to a first carrier frequency (e.g., 500 MHz) and a second analog signal may be modulated to a second carrier frequency (e.g., 600 MHz), and so on. By having different carrier frequencies, transmitter 130 may realize better transmit and/or receive diversity, thereby reducing interference between different channels.

Figure 4:
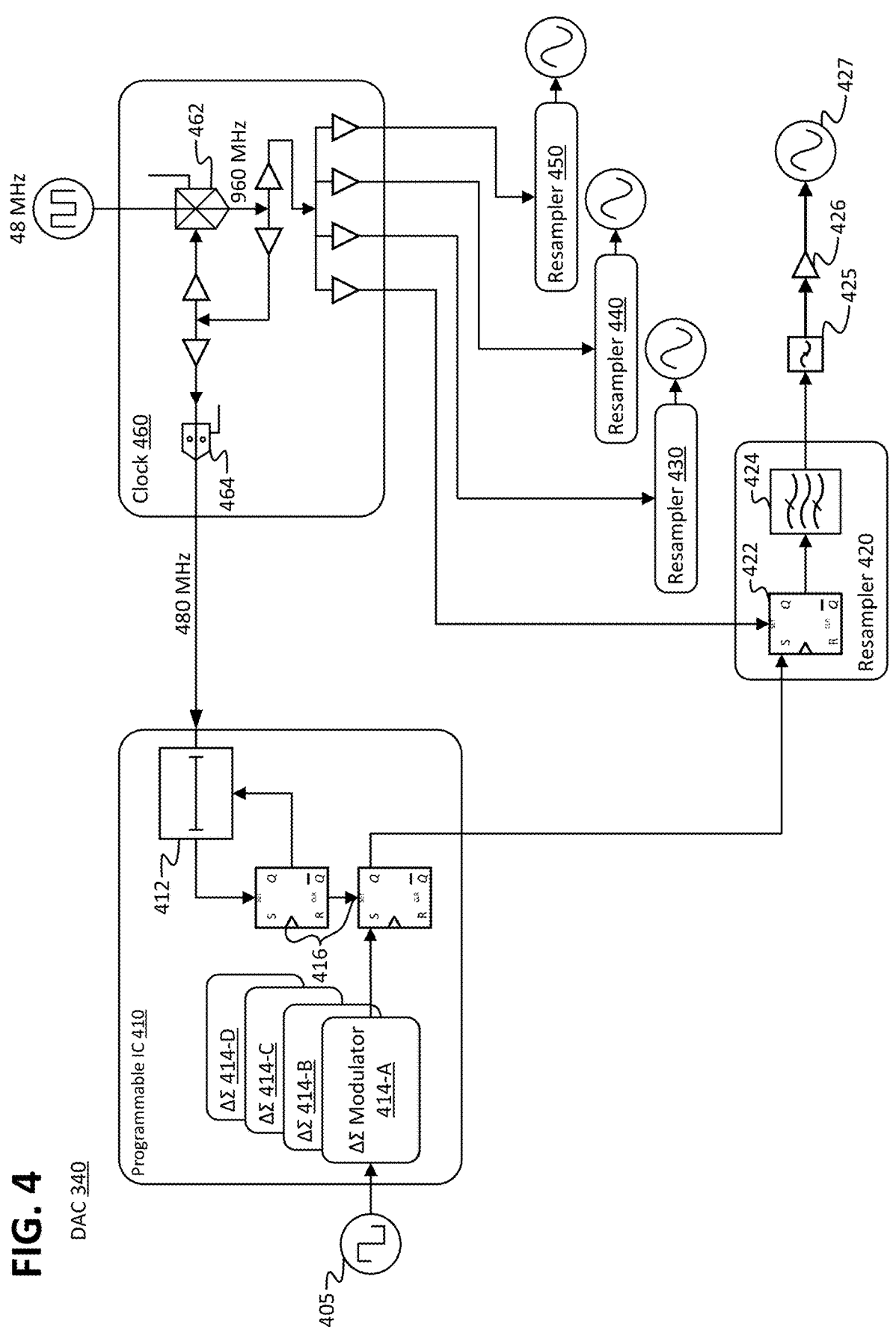
FIG. 4 shows an example of a digital-to-analog converter (DAC) according to one or more aspects of the disclosure.

FIG. 4 shows an example of DAC 340 in accordance with one or more aspects of the disclosure. DAC 340 comprises a programmable integrated circuit field programmable gate array (FPGA) 410, a resampler 420, and a clock 460.

Programmable integrated circuit 410 may encode one or more analog signals to a coarse quantization of 1 bit (e.g., 2 levels). FPGA 410 may comprise a buffer 412, a delta-sigma modulator 414, and a pair of D flip flops 416. Buffer 412 may comprise a phase-locked loop (PLL) zero delay buffer. The PLL zero delay buffer (e.g., buffer 412) may remove clock skew, for example, due to programmable integrated circuit 410's variance over part and/or temperature. The PLL feedback may go external to programmable integrated circuit 410 before being fed back into buffer 412. Buffer 412 may receive a clock signal, for example, from clock 460. The clock signal received by buffer 412 may be 480 MHz. Buffer 412 may provide the clock signal to the delta-sigma modulator 414 and/or the pair of D flip flops 416. The clock signal may drive the delta-sigma modulator 414 and/or the pair of D flip flops 416.

In operation, programmable integrated circuit 410 may receive a digital signal 405 from an external source and provide the digital signal to delta-sigma modulator 414. Delta-sigma modulator 414 may encode a high resolution digital signal, such as digital signal 405, to a coarse quantization of 1 bit (e.g., 2 levels). Digital signal 405 may be an intermediate frequency signal. An intermediate frequency signal may be a signal in which a carrier wave is shifted as an intermediate step in transmission or reception. Delta-sigma modulator 414 may be a digital logic circuit that is implemented in FPGA 410. While only one delta-sigma modulator is shown in FIG. 4, it will be appreciated that a plurality of delta-sigma modulators may execute in parallel on programmable integrated circuit 410. Preferably, programmable integrated circuit 410 may have up to four (4) delta-sigma modulators located thereon. Each delta-sigma modulator, of the plurality of delta-sigma modulators, may receive a different digital signal. Delta-sigma modulator 414 may effectively run at a sample rate of 960 megasamples per second (MSPS), which may generally be beyond the speed of FPGA-based DSP functions (e.g., adders). To accommodate this sampling rate in FPGAs, several methods of parallel processing were used to reduce the sample rate by a factor of 4, from 960 MSPS to 240 MSPS. With the parallel processing, the delta-sigma modulator 414 may be able to run in real-time, for example, in the Artix 7 family of FPGA.

The pair of D flip flops 416 may be configured to operate using double data rate (DDR) transfers. DDR transfers transfer data on both the rising and falling edge of the clock signal. The pair of D flip flops 416 may help with the high-speed data transfer requirements associated with outputting a continuous signal. The continuous signal may be a 1-bit signal. Accordingly, FPGA 414 may receive digital signal 405 and produce a continuous signal based on digital signal 405, for example, using delta-sigma modulator 414 and/or the pair of D flip flops 416. The continuous signal may then be outputted to resampler 420.

In some examples, programmable integrated circuit 410 may comprise on an FPGA or any other suitable programmable and/or configurable integrated circuits. For example, the functionality (i.e., the delta-sigma modulator, the PLL zero delay buffer, and the pair of D flip flops) may be implemented using any suitable processor including one or more: CPUs, GPUs, low-power processors, microcontrollers, ASICs, SOCs, and/or the like.

Resampler 420 may be configured to resample the continuous signal provided by programmable integrated circuit 410 (e.g., via delta sigma modulator 414). Resampler 420 may comprise a 1-bit digital-to-analog converter (DAC). Resampler 420 may create a clean sampling instant for the continuous signal that represents the instant where the continuous signal transitions from discrete time to continuous time. In this regard, the continuous signal (e.g., the 1 bit signal) outputted from programmable integrated circuit 410 may have significant timing jitter and/or additive noise. To address the significant timing jitter and/or additive noise, resampler 420 may implement a resampling process that achieves high dynamic performance, while reducing the timing jitter and/or additive noise. The resampling process implemented by resampler 420 may comprise a two-stage resampling process that may utilize a first resampler 422 and a second resampler 424. Preferably, first resampler 422 may comprise an emitter-coupled logic (ECL) DFF resampler. The first resampler 422 may smooth the shape of the continuous signal. The first resampler 422 may output the smoothed continuous signal to the second resampler 424. The second resampler 424 may be a pulse resampler. Additionally or alternatively, second resampler 424 may comprise a raised-cosine filter configured to perform raised-cosine pulse resampling. Alternatively, the second resampler 424 may be a Nyquist filter or any equivalent thereof. The second resampler 424 may be configured to minimize intersymbol interference (ISI). The second resampler 424 may output an analog signal for further processing. For example, the second resampler 424 may output the analog signal to a filter, such as filter 425. Filter 425 may be a fixed frequency LC filter configured to filter shaped noise. Filter 425 may comprise one or more inductors (L) and/or capacitors (C) to form an LC filter. Additionally or alternatively, filter 425 may comprise a low-pass filter, a high-pass filter, a multiplexer, a band-pass filter, a band-reject filter or the like. Filter 425 may be configured to block, or reduce noise from circuits and/or systems. Additionally or alternatively, filter 425 may separate, or condition, signals. Filter 425 may further output the analog signal to a buffer amplifier, such as buffer amplifier 426. Additionally signal processing may occur via standard RF circuits before the analog signal 427 is outputted by DAC 340. As noted above, the analog signal 427 may be 240 MHz. The two-stage resampling performed by DAC 340 produces a clean, two-state analog signal 427. For example, analog signal 427 may have a signal-to-noise ratio (SNR) of 140 decibels relative to full scale (dBFS)/Hz and a spurious free dynamic range (SFDR) in excess of 100 dB.

As noted above, programmable integrated circuit 410 may have up to four (4) delta-sigma modulators (e.g., 414-A, 414-B, 414-C, 414-D). Programmable integrated circuit 410 may have four (4) inputs, one for each of the four delta-sigma modulators. Similarly, DAC 340 may have a plurality of resamplers (e.g., resamplers 430, 440, 450). Each of the plurality of resamplers may correspond to a respective delta-sigma modulator. For example, a first resampler (e.g., resampler 420) may receive a first continuous signal from a first delta-sigma modulator (e.g., delta-sigma modulator 414). Similarly, a second resampler (e.g., resampler 430) may receive a first continuous signal from a second delta-sigma modulator (not shown). Each delta-sigma modulator of programmable integrated circuit 410 may be connected to its respective resampler via a low-voltage differential signaling (LVDS) interface. Accordingly, the DAC 340 may require only one LVDS differential data line per channel. This reduces the complexity of the digital interface. In this way, DAC 340 may process up to four signals simultaneously.

Clock 460 may provide clocking signals to programmable integrated circuit 410 and resampler 420. The clocking signals may be used to drive both circuits. As shown in FIG. 4, clock 460 may receive a 48 MHz clock signal from a system clock, such as the system clock of transmitter 130. Upon receiving the 48 MHz clock signal, clock 460 may multiply the 48 MHz system clock by a factor, for example, using multiplier 462. Multiplier 462 may be a phase locked loop (PLL) used to multiply the 48 MHz clock signal. The PLL may be a simple integer N (N=20) and implemented completely discretely, including a discrete voltage, sampling phase detector, and/or an active loop filter. Multiplier 462 may be high performance, including low phase noise and/or very low spurious. As shown in FIG. 4, multiplier 462 multiples the 48 MHz system clock by a factor of twenty (20) to produce a 960 MHz signal.

Figure 5:
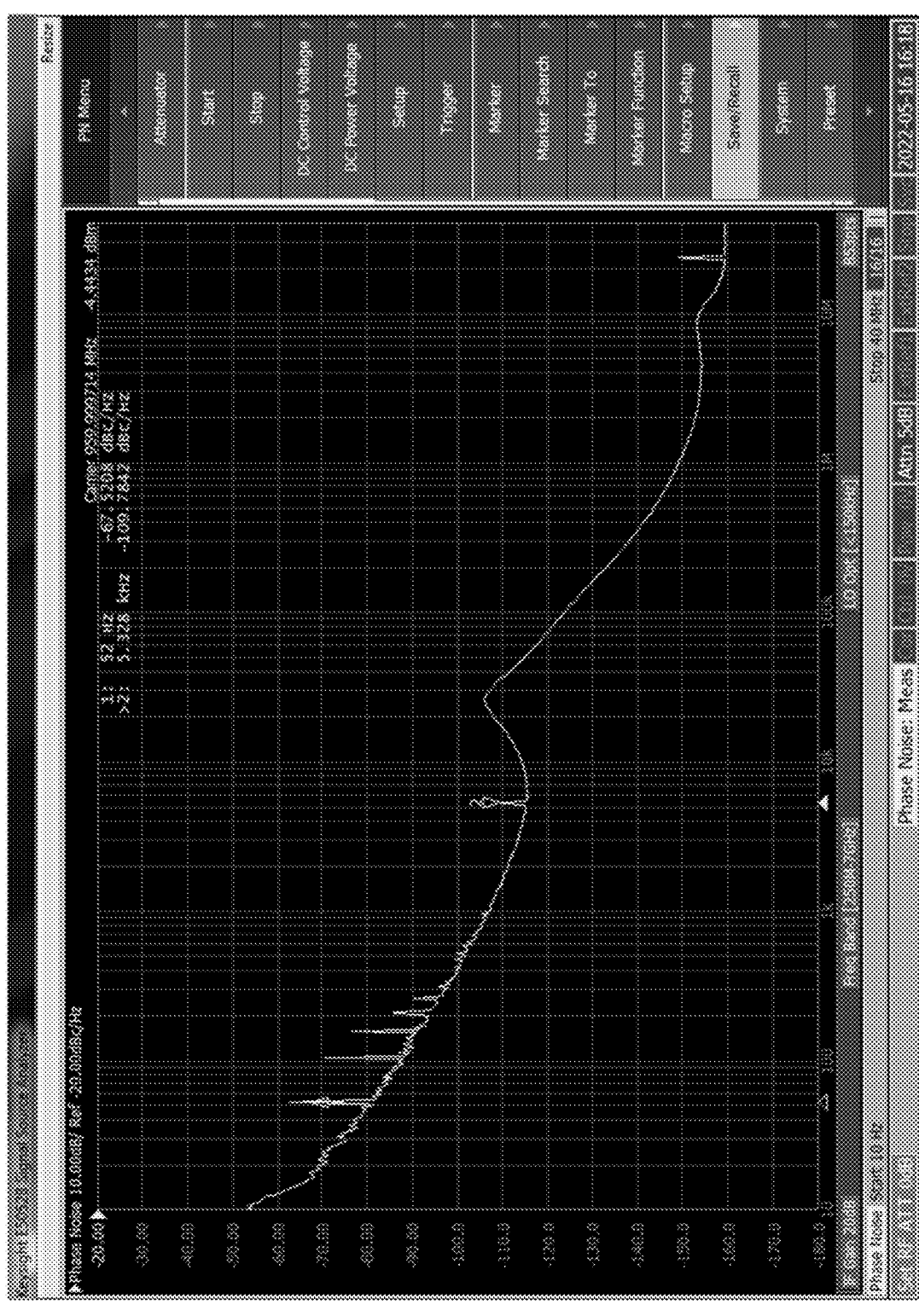
FIG. 5 shows an example of a measured phase noise of the DAC's clock.

By multiplying the clock signal, skew and other artifacts may be introduced into the clock signal. FIG. 5 shows an example of the measured phase noise of the 960 MHz clock. Because the 960 MHz signal may be sent to each of the plurality of resamplers (e.g., 420, 430, 440, 450) via a fanout. The fanout may be achieved using discrete transistor buffers, which can be seen from the unlabeled triangles in FIG. 4. The discrete buffers may be wideband buffers (e.g., filters) configured to manage clock skew. Additionally, these discrete buffers provide an advantage over RF splitter, which are traditionally bulky and cumbersome. Additionally, the 960 MHz signal may be divided by divider 464. As shown in FIG. 4, divider 464 may divide the 960 MHz signal by two (2) to produce a 480 MHz signal. The 480 MHz signal may be provided to programmable integrated circuit 410 as a clocking signal. Thus, clock 460 may fanout the clock signals to the plurality of resamplers (e.g., 420, 430, 440, 450) and programmable integrated circuit 410.

Figure 6:
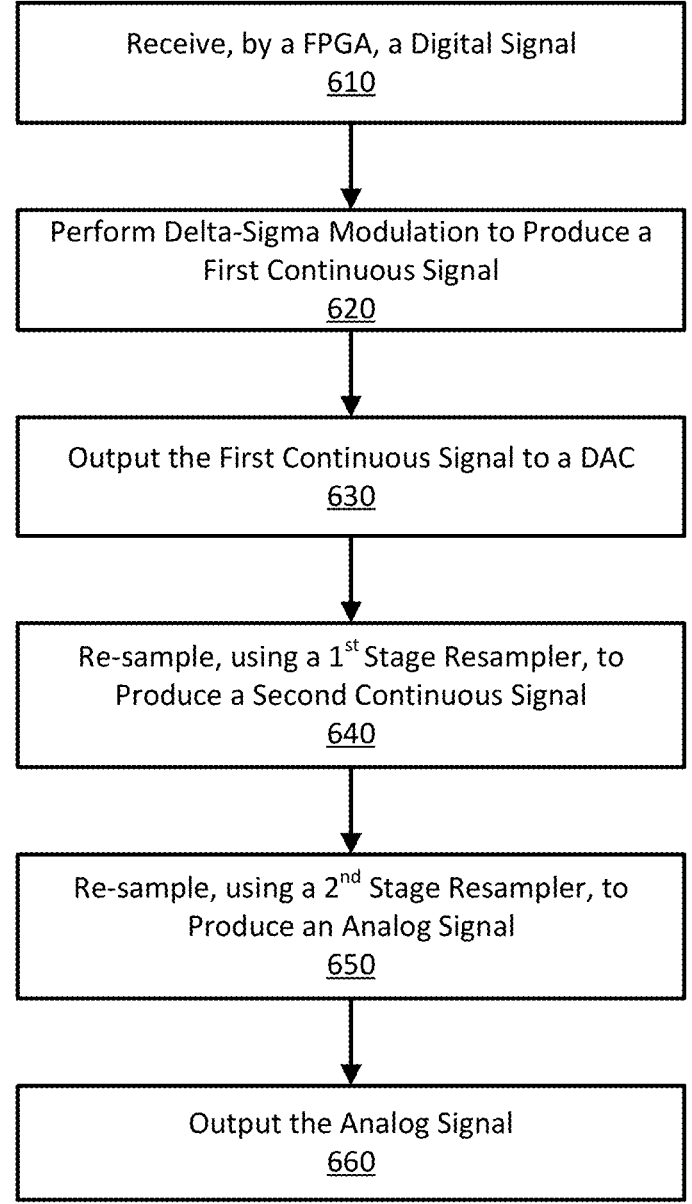
FIG. 6 shows an example of a flowchart for converting a digital signal to an analog signal in according with one or more aspects of the disclosure.

FIG. 6 shows an example of a process 600 for converting a digital signal to an analog signal using a two-stage resampler. The process 600 may be implemented, for example, by transmitter 130 and/or DAC 340.

In step 610, a digital-to-analog converter (DAC) (e.g., a programmable integrated circuit of the DAC) may receive a digital signal. As noted above, the digital signal may be an intermediate frequency a digital signal. In step 620, the DAC (e.g., the programmable integrated circuit) may perform delta-sigma modulation on the digital signal to produce a first continuous signal. After generating the first continuous signal, the programmable integrated circuit may output the continuous signal to a resampler, in step 630. As noted above, the resampler may comprise a two-stage resampler, as discussed above. In preferred examples, the resampler may comprise a 1-bit digital-to-analog converter (DAC) of the intermediate frequency digital-to-analog converter. In step 640, a first-stage resampler may resample the first continuous signal to produce a second continuous signal. The first-stage resampler may comprise an ECL DFF. The first-stage resampler may pass the second continuous signal to a second-stage resampler. In step 650, the second-stage resampler may resample the second continuous signal to produce an analog signal of the digital signal received by the programmable integrated circuit. The second-stage resampler may comprise a raised cosine pulse resampler. In step 660, the DAC may output the analog signal. As noted above, the analog signal maybe 240 MHz. Additionally, outputting the analog signal may include modulating the analog signal to a first carrier frequency so that it may be transmitted to one or more receivers, such as receiver 150.

Although examples are described above, features and/or steps of those examples may be combined, divided, omitted, rearranged, revised, and/or augmented in any desired manner. Various alterations, modifications, and improvements will readily occur to those skilled in the art. Such alterations, modifications, and improvements are intended to be part of this description, though not expressly stated herein, and are intended to be within the spirit and scope of the disclosure. Accordingly, the foregoing description is by way of example only, and is not limiting.

The invention claimed is:

1. A digital-to-analog converter comprising:
   a programmable integrated circuit configured to perform delta-sigma modulation on a received digital signal to produce a first continuous signal;
   a two-stage resampler, wherein the two-stage resampler comprises:
      a first-stage of the two-stage resampler configured to smooth the first continuous signal received from the programmable integrated circuit and output a second continuous signal; and
      a second-stage of the two-stage resampler configured to perform pulse resampling to smooth the second continuous signal produced by the first-stage resampler and output an analog signal corresponding to the received digital signal.

2. The digital-to-analog converter of claim 1, further comprising:
   a clock configured to drive the programmable integrated circuit and the two-stage resampler.

3. The digital-to-analog converter of claim 2, wherein the clock is configured to:
   receive a 48 MHz clock signal;
   convert the 48 MHz clock signal to a 960 MHz clock signal;
   divide the 960 MHz clock signal by two to produce a 480 MHz clock signal;
   output the 480 MHz clock signal to the programmable integrated circuit; and
   output the 960 MHz signal to the two-stage resampler.

4. The digital-to-analog converter of claim 1, wherein the first-stage of the two-stage resampler comprises an ECL D-flip flop (ECL DFF).

5. The digital-to-analog converter of claim 1, wherein the second-stage of the two-stage resampler comprises at least one of a raised-cosine filter or a Nyquist filter.

6. The digital-to-analog converter of claim 1, wherein the second-stage of the two-stage resampler is configured to perform raised-cosine pulse resampling.

7. The digital-to-analog converter of claim 1, further comprising: a plurality of resamplers, wherein the plurality of resamplers execute in parallel.

8. The digital-to-analog converter of claim 1, wherein the programmable integrated circuit further comprises a double data rate (DDR) transfer mechanism configured to smooth the continuous signal prior to the continuous signal being outputted to the resampler.

9. The digital-to-analog converter of claim 1, wherein outputting the analog signal comprises modulating the analog signal to a carrier frequency.

10. The digital-to-analog converter of claim 1, wherein outputting the analog signal comprises transmitting the analog signal to one or more receivers.

11. The digital-to-analog converter of claim 10, wherein the one or more receivers comprises at least one of an in-ear monitor or a speaker.

12. A system comprising:
   a transmitter comprising a digital-to-analog converter, wherein the digital-to-analog converter comprises:
      a programmable integrated circuit configured to perform delta-sigma modulation on a received digital signal to produce a first continuous signal;

a two-stage resampler, wherein the two-stage resampler comprises:

a first-stage of the two-stage resampler configured to smooth the first continuous signal received from the programmable integrated circuit and output a second continuous signal; and a second-stage of the two-stage resampler configured to perform pulse resampling to smooth the second continuous signal produced by the first-stage resampler and output an analog signal corresponding to the received digital signal; and a receiver configured to receive the analog signal produced by the transmitter.

13. The system of claim 12, wherein the transmitter further comprises a clock configured to drive the programmable integrated circuit and the two-stage resampler.

14. The system of claim 13, wherein the transmitter further comprises:

a second clock configured to produce a 48 MHz clock signal, wherein the clock is configured to:

receive the 48 MHz clock signal;

convert the 48 MHz clock signal to a 960 MHz clock signal;

divide the 960 MHz clock signal by two to produce a 480 MHz clock signal;

output the 480 MHz clock signal to the programmable integrated circuit; and output the 960 MHz signal to the two-stage resampler.

15. The system of claim 12, wherein the digital-to-analog converter comprises a plurality of resamplers configured to execute in parallel with the resampler.

16. A method comprising:

receiving, by a programmable integrated circuit of a digital-to-analog converter, a digital signal;

performing, by the programmable integrated circuit, delta-sigma modulation on the digital signal to produce a first continuous signal;

outputting, by the programmable integrated circuit, the continuous signal to a resampler;

performing, using a first-stage of the resampler, resampling of the first continuous signal to produce a second continuous signal;

performing, using a second-stage of the resampler, pulse resampling of the second continuous signal to produce an analog signal of the digital signal received by the programmable integrated circuit; and outputting the analog signal.

17. The method of claim 16, further comprising:

receiving, by a first clock of the digital-to-analog converter a 48 MHz clock signal from a second clock of a transmitter;

converting, by the first clock, the 48 MHz clock signal to a 960 MHz clock signal;

dividing, by the first clock, the 960 MHz clock signal by two to produce a 480 MHz clock signal;

outputting, by the first clock to the programmable integrated circuit, the 480 MHz clock signal; and outputting, by the first clock to the resampler, the 960 MHz signal.

18. The method of claim 16, wherein:

the first-stage of the resampler comprises an ECL DFF; and the second-stage of the resampler comprises a raised-cosine filter.

19. The method of claim 16, further comprising:

outputting the analog signal by transmitting the analog signal to one or more receivers, wherein the one or more receivers comprises at least one of an in-ear monitor or a speaker.

20. The method of claim 16, further comprising:

outputting the analog signal by modulating the analog signal to a carrier frequency.

* * * * *